(12) United States Patent
Declerck et al.

(10) Patent No.: US 12,422,301 B2
(45) Date of Patent: Sep. 23, 2025

(54) INFRARED EMITTER CHECKING CIRCUIT AND METHOD

(71) Applicant: Harman International Industries, Incorporated, Stamford, CT (US)

(72) Inventors: Daniel J. Declerck, Milford, MI (US); Phillip Eric McGee, White Lake Township, MI (US)

(73) Assignee: Harman International Industries, Incorporated, Stamford, CT (US)

( * ) Notice: Subject to any disclaimer, the term of this patent is extended or adjusted under 35 U.S.C. 154(b) by 241 days.

(21) Appl. No.: 18/241,672

(22) Filed: Sep. 1, 2023

(65) Prior Publication Data

US 2025/0076109 A1    Mar. 6, 2025

(51) Int. Cl.
   *G01J 1/44*   (2006.01)
   *H03K 3/037*  (2006.01)

(52) U.S. Cl.
   CPC ............... *G01J 1/44* (2013.01); *H03K 3/037* (2013.01)

(58) Field of Classification Search
   CPC .................................. G01J 1/44; H03K 3/037
   See application file for complete search history.

(56) References Cited

U.S. PATENT DOCUMENTS

| | | | |
|---|---|---|---|
| 2007/0143771 A1* | 6/2007 | Zhou | G11B 7/0948 720/658 |
| 2021/0088784 A1* | 3/2021 | Whitmire | G02B 27/0101 |
| 2025/0054314 A1* | 2/2025 | Grauer | H04N 5/33 |

* cited by examiner

*Primary Examiner* — Casey Bryant
(74) *Attorney, Agent, or Firm* — Brooks Kushman, P.C.

(57) ABSTRACT

In at least one embodiment, an apparatus is provided. The apparatus includes a measurement circuit, a trigger determination circuit, and a latch circuit. The measurement circuit is configured to receive an input signal from a transmitting source and to provide an averaged input signal based on the input signal. The trigger determination circuit is configured to receive the averaged input signal and to compare the averaged input signal to a predetermined threshold. The trigger determination circuit is further configured to provide a first output indicative of the averaged input signal exceeding the predetermined threshold. The latch circuit is configured to receive the first output and to trigger a latch condition to prevent the transmitting source from transmitting the input signal in response to the first output.

20 Claims, 3 Drawing Sheets

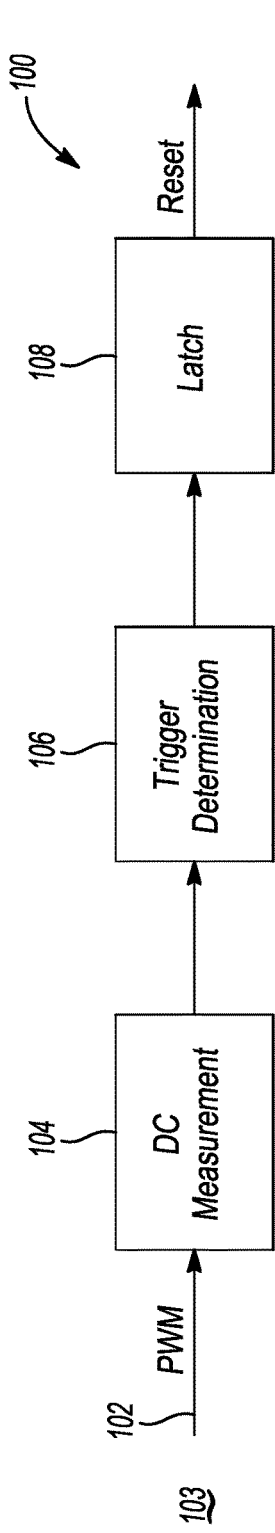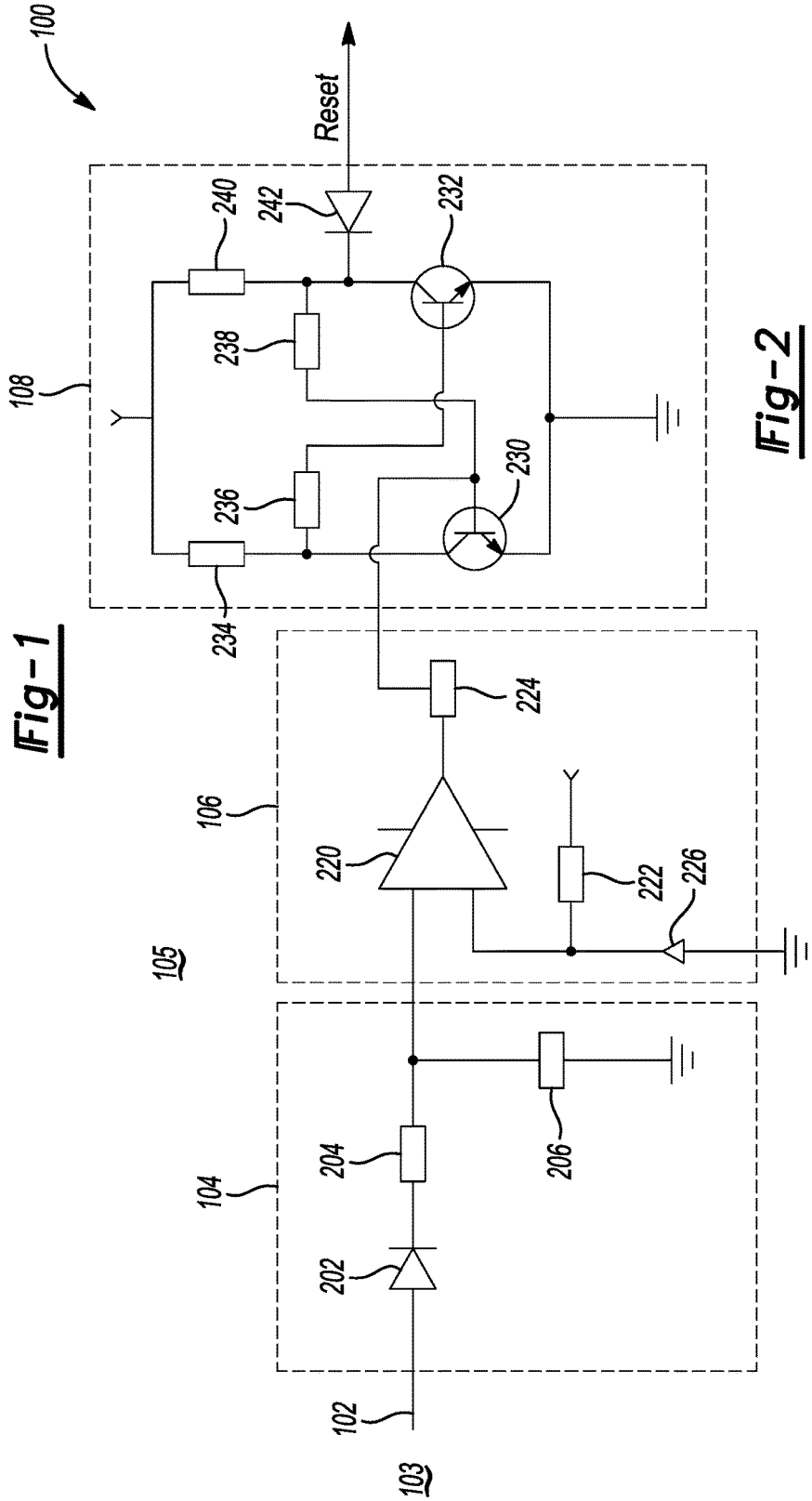

INFRARED EMITTER CHECKING CIRCUIT AND METHOD

TECHNICAL FIELD

Aspects disclosed herein generally relate to an infrared (IR) emitter checking circuit and method. These aspects and others will be discussed in more detail below.

BACKGROUND

Monitoring cameras as positioned in vehicles are generally known to use an infrared emitter for transmitting IR signals to monitor a driver and/or passengers in the vehicle. However, too much exposure to the IR signals may not be healthy for a driver's and passenger's eyes.

SUMMARY

In at least one embodiment, an apparatus is provided. The apparatus includes a measurement circuit, a trigger determination circuit, and a latch circuit. The measurement circuit is configured to receive an input signal from a transmitting source and to provide an averaged input signal based on the input signal. The trigger determination circuit is configured to receive the averaged input signal and to compare the averaged input signal to a predetermined threshold. The trigger determination circuit is further configured to provide a first output indicative of the averaged input signal exceeding the predetermined threshold. The latch circuit is configured to receive the first output and to trigger a latch condition to prevent the transmitting source from transmitting the input signal in response to the first output.

In at least another embodiment, an apparatus is provided. The apparatus includes a transmitting source and at least one controller. The transmitting source is configured to transmit an input signal. The at least one controller is programmed to provide an averaged input signal based on the input signal and to compare the averaged input signal to a predetermined threshold. The at least one controller is further programmed to provide a first output indicative of the averaged input signal exceeding the predetermined threshold and to trigger a latch condition to prevent the transmitting source from transmitting the input signal in response to the averaged input signal exceeding the predetermined threshold.

In at least another embodiment, a method is provided. The method includes receiving an input signal from a transmitting source and providing, via at least one controller, an averaged input signal based on the input signal. The method further includes comparing the averaged input signal to a predetermined threshold and providing a first output indicative of the averaged input signal exceeding the predetermined threshold. The method further includes triggering a latch condition to prevent the transmitting source from transmitting the input signal in response to the averaged input signal exceeding the predetermined threshold.

BRIEF DESCRIPTION OF THE DRAWINGS

The embodiments of the present disclosure are pointed out with particularity in the appended claims. However, other features of the various embodiments will become more apparent and will be best understood by referring to the following detailed description in conjunction with the accompany drawings in which:

FIG. 1 generally illustrates an apparatus for monitoring an infrared signal in accordance with one embodiment;

FIG. 2 generally illustrates a detailed implementation of the apparatus of FIG. 1 in accordance with one embodiment;

DETAILED DESCRIPTION

Figure 3:
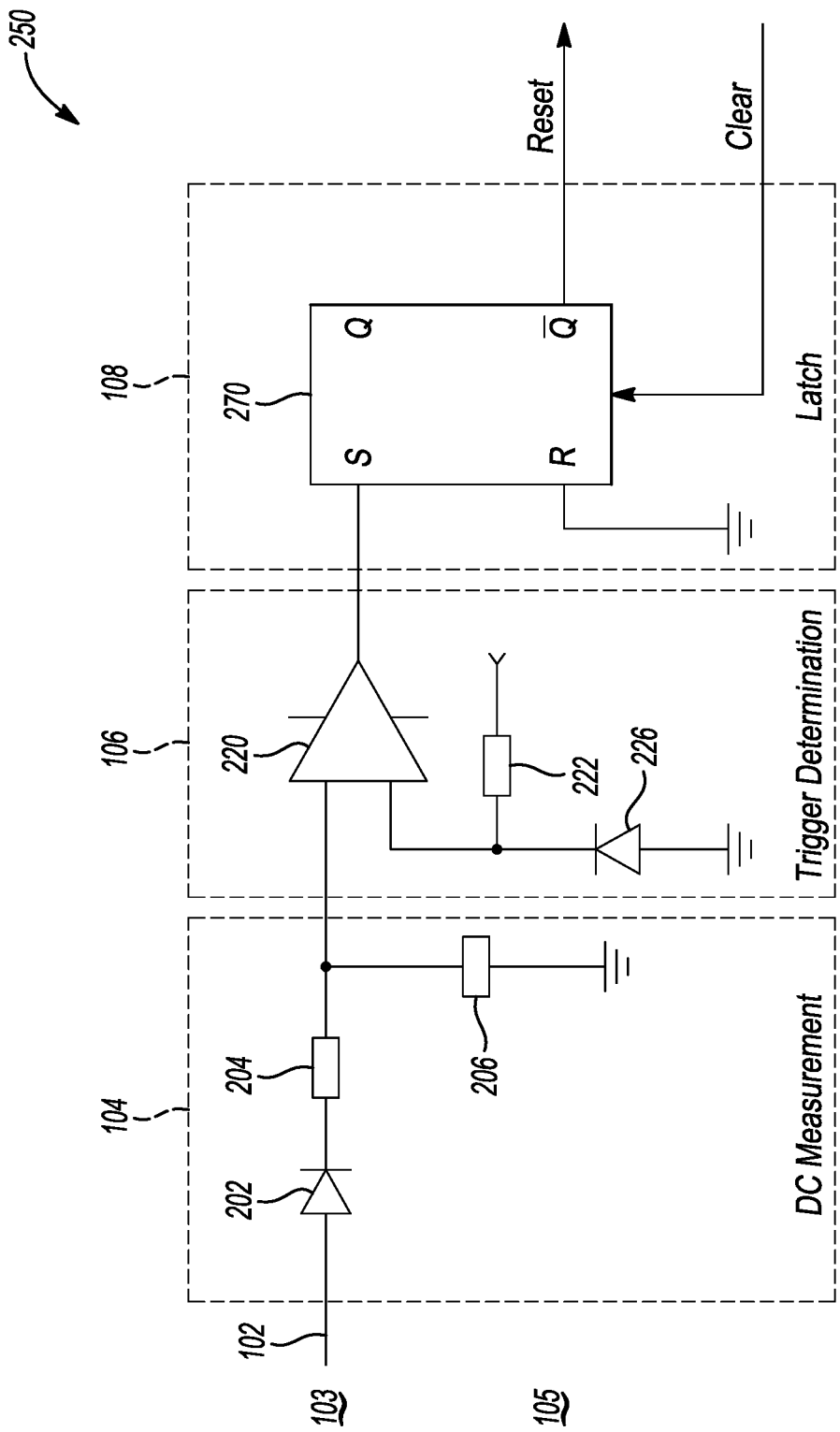
FIG. 3 generally illustrates another detailed implementation of the apparatus of FIG. 1 in accordance with one embodiment.

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

In general, the need for an eye-safe infrared (IR) emission may require the use of a checking circuit to disable an IR transmitter when the possibility of unsafe emissions occurs. Vehicle applications, such as IR camera, may utilize at least one IR transmitter to transmit IR control signals within the vehicle to monitor a driver and passenger(s) in the vehicle. Thus, the disclosed checking circuit (or apparatus) may be employed to disable the IR transmitter when various preconditions have been met. The disclosed apparatus may utilize hardware-based components which may be simpler and easier to use in light of complex software solutions. It is recognized that while the disclosed apparatus may be used in connection with an IR based camera for vehicle applications, the disclosed apparatus may be used in connection with any transmitter that transmits any non-ionizing radiation signal that may be received by any individual irrespective of the final application in which the transmitter is used.

FIG. 1 generally depicts an apparatus 100 for monitoring an infrared (IR) signal 102 in accordance with one embodiment. The apparatus 100 generally includes a measurement circuit 104, a trigger determination circuit 106, and a latch circuit 108. In general, the measurement circuit 104 receives an IR control signal as a pulse width modulated (PWM) signal and measures a duty cycle of the PWM signal. A source 103 (or transmitting source 103) provides the IR control signal 102 to the measurement circuit 104. In one example, the source 103 may be a camera (or camera module) or other image capture device. In one example, the measurement circuit 104 obtains an average of a duty cycle of the IR control signal 102. In one example, the measurement circuit 104 may be implemented, for example, as an Analog to Digital Converter (ADC) or a resistor-capacitor (RC) circuit to average the PWM based IR control signal for trigger determination. The trigger determination circuit 106 compares, for example, the average value of the PWM duty cycle to a predetermined threshold. The trigger determination circuit 106 provides an output indicative of whether the value of the PWM duty cycle has exceeded or not exceeded the predetermined threshold. The trigger determination circuit 106 may include, but not limited, to any number or microprocessors or a plurality of transistors that perform the comparison of the average value of the PWM duty cycle to the predetermined threshold.

The latch circuit 108 may disable the device (e.g., the camera) that transmits the IR control signal in response to the average value of the PWM duty cycle exceeding the predetermined threshold. In this example, the latch circuit 108 may continuously assert a specific logic state once PWM duty cycle of the IR control signal exceeds the predetermined threshold and may disable the transmitting device that provides the IR control signal until the latch circuit 108 is reset. It is recognized that the latch circuit 108 may not be required and that a controller (not shown) may simply disable the device that transmits the IR control signal when the average value of the PWM duty cycle of the IR control signal is detected to exceed the predetermined threshold. Once the average value of the PWM duty cycle of the IR control signal is detected to be below the predetermined threshold (or within a desired operating range), the controller may then activate the transmitting device to provide the IR control signal. The latch circuit 108 may be implemented using (i) any number of transistors, (ii) a latching comparator, (iii) digital logic gates, (iv) an electromechanical relay, (v) any number of flip flops, etc.

FIG. 2 generally illustrates a detailed implementation of the apparatus 100 of FIG. 1 in accordance with one embodiment. The apparatus 100 includes the measurement circuit 104, the trigger determination circuit 106, and the latch circuit 108. It is recognized that the measurement circuit 104, the trigger determination circuit 106, and the latch circuit 108 may be implemented in any one or more controllers 105 ("the controller 105"). The controller 105 may perform any of the noted operations as disclosed herein. The measurement circuit 104 includes a diode 202, a resistor 204, and a capacitor 206. The diode 202 is placed in series with the IR control signal (or PWM signal) 102 to isolate the rest of the apparatus 100 from any loading from the source 103 that provides the IR control signal 102 to allow a logic high voltage of the transmitter (or source 103) that provides the IR control signal 102 to pass to the rest of the apparatus 100. It is recognized that a similar isolation may also be achieved by a transistor instead of the diode 202. The RC combination formed by the resistor 204 and the capacitor 206 creates, for example, a proportionally averaged voltage value (or averaged input signal) that is based on a direct current (DC) of the PWM signal (or the IR control signal 102). This condition assumes a push-pull driven signal and that some changes may be necessary for a passive pull-up/open collector driven signal. In one example, assuming the logic high value of the PWM of the IR control signal 102 is 5.0 V and has a 50% duty cycle, then the averaged voltage of the RC portion of the measurement circuit 104 is 2.5 V. In general, the responsiveness to change the PWM of the IR control signal 102, and the duration of being able to sustain the voltage may depend on the values selected for the resistor 204 and the capacitor 206.

The trigger determination circuit 106 includes a comparator 220, a first resistor 222, a second resistor 224, and a diode 226. In one example, the diode 226 may be implemented as a Zener diode thus enabling the trigger determination circuit 106 to be voltage independent. If a regulated voltage is provided to the trigger determination circuit 106, then a lower cost resistor divider may be used instead of the diode 226. The diode 226 may be used to create a reference voltage that the comparator 220 may use for comparison to the received averaged voltage signal from the measurement circuit 104. The comparator 220 compares the averaged voltage signal to a reference voltage established by the diode 226. The reference voltage may be referred to as the predetermined threshold.

The comparator 220 generates an output after comparing the averaged voltage signal to the reference voltage. For example, the comparator 220 may generate either a logic high output or a logic low output based on the comparison between the averaged voltage signal and the reference voltage (or predetermined threshold). In particular, the comparator 220 may generate a logic high output in response to the averaged voltage signal exceeding the predetermined threshold. This condition is generally indicative of a condition in which it is necessary to disable the transmitter (e.g., camera) that transmits the IR control signal 102. The comparator 220 may generate a logic low output in response to the averaged voltage signal being less than the predetermined threshold. This condition is illustrative of the IR control signal 102 being in an acceptable operating range.

The comparator 220 may account for hysteresis to prevent oscillation if the two voltages (e.g., the averaged voltage signal and the reference voltage) are of nearly similar values. In general, the comparator 220 may be selected to provide a desired amount of hysteresis. It is recognized that a desired amount of hysteresis may also be provided if an operational amplifier was utilized instead of the comparator 220. At a high level, hysteresis may require a feedback path from an output that affected the input path, to ensure that asymmetric voltages are used for the trigger. In other words, one trigger voltage may be used for a rising edge, and a different trigger voltage may be used for a falling edge. The second resistor 224 provides an output impedance for the trigger determination circuit 106. It is recognized that additional resistors may be required to also serve as the output impedance along with the second resistor 224 for the comparator 220 to operate in a desired mode.

The latch circuit 108 includes first and second transistors 230 and 232, a first resistor 234, a second resistor 236, a third resistor 238, a fourth resistor 240, and a diode 242. In one example, the first and second transistors 230 and 232 may be implemented as NPN transistors. In general, the latch circuit 108 is configured to latch a specific logic state on a target signal line (i.e., output or "RESETn"). In one example, the RESETn may be triggered when the output of the latch circuit 108 is high. Thus, in this regard, the RESETn input may be an active low input to the latch circuit 108 and is activated in response to the latch circuit 108 providing a ground for the RESETn input. The first resistor 234 and the fourth resistor 240 limit the current through the first transistor 230 and the second transistor 232. The apparatus 100 generally provides two options for providing an output therefrom. The second transistor 232 is generally activated in response to the output of the comparator 220 providing the logic high output. This condition is indicative of an averaged signal of the IR control signal exceeding the predetermined threshold. When the signal through the second resistor 224 of the trigger determination circuit 106 is HIGH, then the first transistor 230 operates in saturation (or is activated) thereby driving a collector of the first transistor 230 to a near ground voltage state (e.g., the first transistor 230 is "Off"). A base of the second transistor 232 through the second resistor 236 is activated which then enables the high state of the RESETn input to be grounded through the latch circuit 108. Therefore, a latch condition is set to transmit a signal to the source 103 that generates the IR control signal to stop the operation of transmitting the IR control signal. On the other hand, when the signal through second resistor 224 of the trigger determination circuit 106 is LOW (e.g., the average of the IR control signal is below the predetermined threshold), then the noted sequence repeats with the intermediate states being inverted, resulting in the RESETn signal being a logic LOW where the RESETn is not activated and the source 103 is free to continue transmitting the average of the IR control signal. In this case, the first transistor 230 is active and the second transistor 232 is deactivated thereby preventing the high load on the RESETn input from reaching ground and thus avoiding the need to alert the system of a possible failure mode with respect to the IR control signal.

The presence of the diode D2 prevents the first resistor 234, the second resistor 236, the third resistor 238 and the fourth resistor 240 from adversely affecting the timing capabilities of the RESETn signal, by only allowing the logic LOW state from asserting the net when present. For example, by providing an active low input with the RESETn via the diode 242, as soon as a ground condition is detected in response to the second transistor 232 being activated, this condition may serve to provide a faster indication of a possible failure condition with respect to the IR control signal exceeding the predetermined threshold. If RESETn was configured as an active high signal relative to the latch circuit 108, this may require some additional delay to account for the first, second, and third resistors 234, 236, and 238, respectively, reaching the desired voltage amount to activate the base of the second transistor 232 and therefore activate the RESETn input. The diode 242 prevents unnecessary loading of the RESETn (or trigger condition), and this isolation may be achieved in different manners. Options may include using an opto-coupler, transistors, or operations amplifiers. Additionally, with the diode 242, it is possible to allow the assertion of a desired logic state upon multiple different target signal lines. It is recognized that the latch circuit 108 may operate in a manner inverse the assumptions noted above in connection with the activation and deactivation of the first transistor 230 and the second transistor 232 as noted above. If the inverse operation occurred (e.g., first transistor 230 is active and second transistor 232 is deactivated in response to detecting that the IR control signal exceeds the predetermined threshold, then the operation of the RESET signal is also inverted. In this case, the RESETn signal becomes an active high input.

FIG. 3 generally illustrates another detailed implementation of the apparatus 250 of FIG. 1 in accordance with one embodiment. The apparatus 250 includes the measurement circuit 104, the trigger determination circuit 106, and the latch circuit 108. The measurement circuit 104 is similar to the measurement circuit 104 as set forth above in connection with the apparatus 100. The trigger determination circuit 106 is generally similar to the trigger determination circuit 106 of the apparatus 100, however the trigger determination circuit 106 of FIG. 3 does not include the second resistor 224. In addition, the latch circuit 108 includes a flip flop 270 instead of the other circuitry noted in connection with the latch circuit 108 of FIG. 2. In one example, the flip flop 270 may be implemented as a Set-Reset flip flop.

The flip flop 270 includes a first input (e.g., set input(S)) and a second input (e.g., reset input (R)). As shown, the second input is tied to ground. The flip flop 270 also includes a first output (e.g., "$\overline{Q}$") that provides a RESET to serve as an indicator that the IR control signal exceeds the predetermined threshold once this condition is detected. Similar to that described in connection with FIG. 2, the comparator 220 may generate either a logic high output or a logic low output based on the comparison between the averaged voltage signal and the reference voltage (or predetermined threshold). In particular, the comparator 220 may generate a logic high output in response to the averaged voltage signal exceeding the predetermined threshold. This condition is generally indicative of a condition in which it is necessary to disable the transmitter (e.g., camera) that transmits the IR control signal 102. In response, the flip flop 270 may output a logic LOW on the first output (e.g., "$\overline{Q}$") until the condition that causes the IR control signal to exceed the predetermined threshold is removed. When a trigger is detected, the flip flop 270 sets a latch to disable the transmitter from transmitting the IR control signal 102. The transmitter refrains from transmitting the IR control signal 102 as long as the latch is set by the flip flop 270. The flip flop 270 may reset (or remove) the latch condition by toggling the logic state on an input CLEAR as provided to the flip flop 270. In general, the device that resets the flip flop 270 (e.g., resets or remove the latch condition) and provides on input CLEAR of the flip flop 270 may be a system driven source that is external to the apparatus 250. It is recognized that the flip flop 270 may alternatively output a logic HIGH on the first output (e.g., "Q") as opposed to a logic LOW until the condition that causes the IR control signal to exceed the predetermined threshold is removed.

Figure 4:
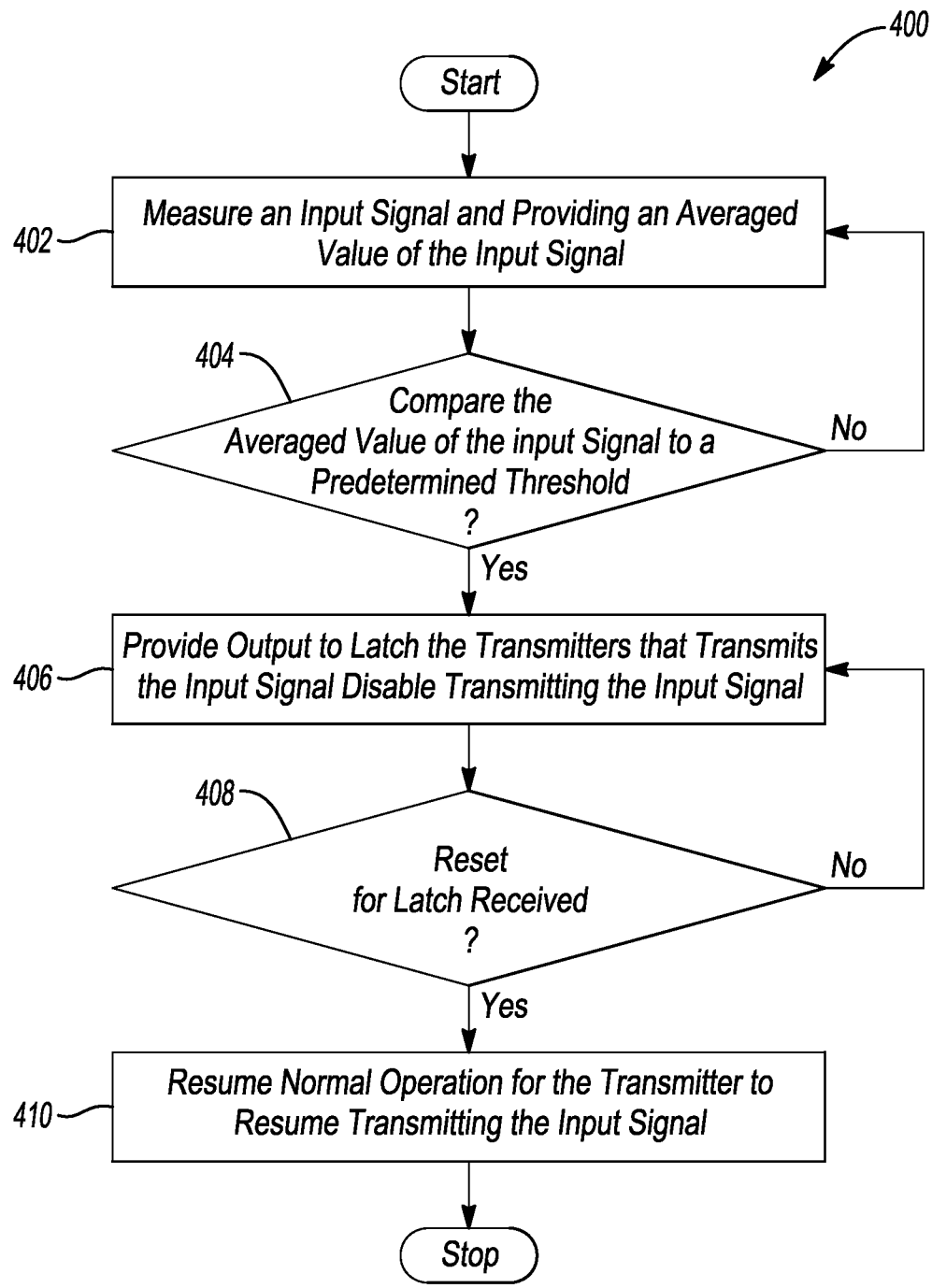
FIG. 4 depicts a method for monitoring the IR signal in accordance with one embodiment.

FIG. 4 depicts a method 400 for monitoring the IR control signal in accordance with one embodiment. In operation 402, the measurement circuit 104 receives an input signal (e.g., the IR signal 102) and generates an averaged value (or voltage) of the input signal 102 as described above in connection with FIG. 2.

In operation 404, the trigger determination circuit 106 compares the averaged value of the input signal 102 (e.g., average input signal) to the predetermined threshold. If the trigger determination circuit 106 determines that the averaged value of the input signal 102 is greater than the predetermined threshold, then the method 400 moves to operation 406. If the trigger determination circuit 106 determines that the averaged value of the input signal 102 is less than the predetermined threshold, then the method 400 moves back to operation 402.

In operation 406, the latch circuit 108 latches the source 103 (or transmitter) that provides the input signal 102 such that the source 103 that provides the input signal 102 is disabled. In operation 401, the latch circuit 108 determines whether a reset has been received. If the latch circuit 108 has been reset, then the method 400 moves to operation 410. If not, then the method 400 remains in operation 406. In operation 410, the latch circuit 108 removes the reset and the transmitter may resume transmitting the input signal 102.

It is recognized that the controllers as disclosed herein may include various microprocessors, integrated circuits, memory devices (e.g., FLASH, random access memory (RAM), read only memory (ROM), electrically programmable read only memory (EPROM), electrically erasable programmable read only memory (EEPROM), or other suitable variants thereof), and software which co-act with one another to perform operation(s) disclosed herein. In addition, such controllers as disclosed utilizes one or more microprocessors to execute a computer-program that is embodied in a non-transitory computer readable medium that is programmed to perform any number of the functions as disclosed. Further, the controller(s) as provided herein includes a housing and the various number of microprocessors, integrated circuits, and memory devices ((e.g., FLASH, random access memory (RAM), read only memory (ROM), electrically programmable read only memory (EPROM), electrically erasable programmable read only memory (EEPROM)) positioned within the housing. The controller(s) as disclosed also include hardware-based inputs and outputs for receiving and transmitting data, respectively from and to other hardware-based devices as discussed herein.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. An apparatus comprising:
   a measurement circuit configured to receive an input signal from a transmitting source and to provide an averaged input signal based on the input signal; and
   a trigger determination circuit configured to:
      receive the averaged input signal;
      compare the averaged input signal to a predetermined threshold; and
      provide a first output indicative of the averaged input signal exceeding the predetermined threshold; and
   a latch circuit configured to:
      receive the first output; and
      trigger a latch condition to prevent the transmitting source from transmitting the input signal in response to the first output.

2. The apparatus of claim 1, wherein the measurement circuit includes a resistor-capacitor (RC) network configured to provide the averaged input signal.

3. The apparatus of claim 2, wherein the input signal is a pulse width modulated (PWM) signal, and wherein the RC network is further configured to provide an averaged voltage value of the PWM signal.

4. The apparatus of claim 1, wherein the predetermined threshold corresponds to a reference voltage.

5. The apparatus of claim 4, wherein the trigger determination circuit includes a comparator configured to compare the reference voltage to the averaged input signal.

6. The apparatus of claim 5, wherein the trigger determination circuit includes a diode and a resistor to establish the reference voltage.

7. The apparatus of claim 1, wherein the trigger determination circuit includes at least pair of switches to trigger the latch condition based on the first output.

8. The apparatus of claim 1, wherein the trigger determination circuit includes a flip-flop circuit to trigger the latch condition based on the first output.

9. The apparatus of claim 1, wherein the input signal is an infrared (IR) based signal transmitted from a camera.

10. An apparatus comprising:
    a transmitting source configured to transmit an input signal; and
    at least one controller programmed to:
       provide an averaged input signal based on the input signal;
       compare the averaged input signal to a predetermined threshold; and
       provide a first output indicative of the averaged input signal exceeding the predetermined threshold; and
       trigger a latch condition to prevent the transmitting source from transmitting the input signal in response to the averaged input signal exceeding the predetermined threshold.

11. The apparatus of claim 10, wherein the at least one controller includes a resistor-capacitor (RC) network configured to provide the averaged input signal.

12. The apparatus of claim 11, wherein the input signal is a pulse width modulated (PWM) signal, and wherein the RC network is further configured to provide an averaged voltage value of the PWM signal.

13. The apparatus of claim 10, wherein the predetermined threshold corresponds to a reference voltage.

14. The apparatus of claim 13, wherein the at least one controller includes a comparator configured to compare the reference voltage to the averaged input signal.

15. The apparatus of claim 13, wherein the at least one controller includes a diode and a resistor to establish the reference voltage.

16. The apparatus of claim 10, wherein the at least one controller includes a pair of switches to trigger the latch condition based on the first output.

17. The apparatus of claim 10, wherein the at least one controller includes a flip-flop circuit to trigger the latch condition based on the first output.

18. The apparatus of claim 10, wherein the input signal is an infrared (IR) based signal transmitted from a camera.

19. A method comprising:
    receiving an input signal from a transmitting source
    providing, via at least one controller, an averaged input signal based on the input signal;
    comparing the averaged input signal to a predetermined threshold; and
    providing a first output indicative of the averaged input signal exceeding the predetermined threshold; and
    triggering a latch condition to prevent the transmitting source from transmitting the input signal in response to the averaged input signal exceeding the predetermined threshold.

20. The method of claim 19, wherein the input signal is an infrared (IR) based signal transmitted from a camera.

* * * * *